US012149246B2

(12) United States Patent
Fitzi

(10) Patent No.: US 12,149,246 B2
(45) Date of Patent: Nov. 19, 2024

(54) CIRCUIT ARRANGEMENT AND METHOD FOR CHARGE INTEGRATION

(71) Applicant: ams International AG, Jona (CH)

(72) Inventor: Andreas Fitzi, Staefa (CH)

(73) Assignee: ams International AG, Jona (CH)

( * ) Notice: Subject to any disclaimer, the term of this patent is extended or adjusted under 35 U.S.C. 154(b) by 319 days.

(21) Appl. No.: 17/634,259

(22) PCT Filed: Jul. 24, 2020

(86) PCT No.: PCT/EP2020/070956
§ 371 (c)(1),
(2) Date: Feb. 10, 2022

(87) PCT Pub. No.: WO2021/028195
PCT Pub. Date: Feb. 18, 2021

(65) Prior Publication Data
US 2022/0321130 A1   Oct. 6, 2022

(30) Foreign Application Priority Data

Aug. 14, 2019 (EP) .................................... 19191721

(51) Int. Cl.
*H03K 21/02* (2006.01)
*G01T 1/24* (2006.01)
(Continued)

(52) U.S. Cl.
CPC ........... *H03K 21/023* (2013.01); *G01T 1/247* (2013.01); *G01T 1/366* (2013.01); *H03K 21/08* (2013.01)

(58) Field of Classification Search
CPC ....... G01T 1/247; G01T 1/366; H03K 21/023; H03K 21/08; H03K 21/38; H03K 21/02
See application file for complete search history.

(56) References Cited

U.S. PATENT DOCUMENTS

2010/0187432 A1* 7/2010 Herrmann ............... G01T 1/171
250/336.1

FOREIGN PATENT DOCUMENTS

| EP | 3385756 A1 | 10/2018 |
| EP | 3510928 A1 | 7/2019 |

(Continued)

OTHER PUBLICATIONS

International Search Report issued for the corresponding International application No. PCT/EP2020/070956, dated Oct. 19, 2020, 3 pages (for informational purposes only).

(Continued)

*Primary Examiner* — David P Porta
*Assistant Examiner* — Casey Bryant
(74) *Attorney, Agent, or Firm* — Viering, Jentschura & Partner mbB

(57) ABSTRACT

A circuit arrangement for charge integration may include an input for applying a signal representing charge pulses, an output for providing an integrated signal, and an integrating circuit connected between the input and the output, comprising a resistive circuit and a capacitor and having an RC time constant which is a function of the resistive circuit and the capacitor. The circuit arrangement may include a feedback control circuit connected at its input, to the output of the circuit arrangement and providing, at its output, a control signal, where at least one of the resistive circuit and the capacitor has a variable value based on the control signal.

11 Claims, 4 Drawing Sheets

(51) Int. Cl.
*G01T 1/36* (2006.01)
*H03K 21/08* (2006.01)

(56) References Cited

FOREIGN PATENT DOCUMENTS

| | | |
|---|---|---|
| JP | 2006222988 A | 8/2006 |
| KR | 20030077232 A | 10/2003 |

OTHER PUBLICATIONS

European Search Report issued for the corresponding european application No. EP 19 19 1721, dated Feb. 13, 2020, 8 pages (for informational purposes only).
Korean Notice of Allowance for corresponding Korean Application No. 10-2022-7008033, dated Jul. 8, 2024, 3 pages (for informational purposes only).

* cited by examiner

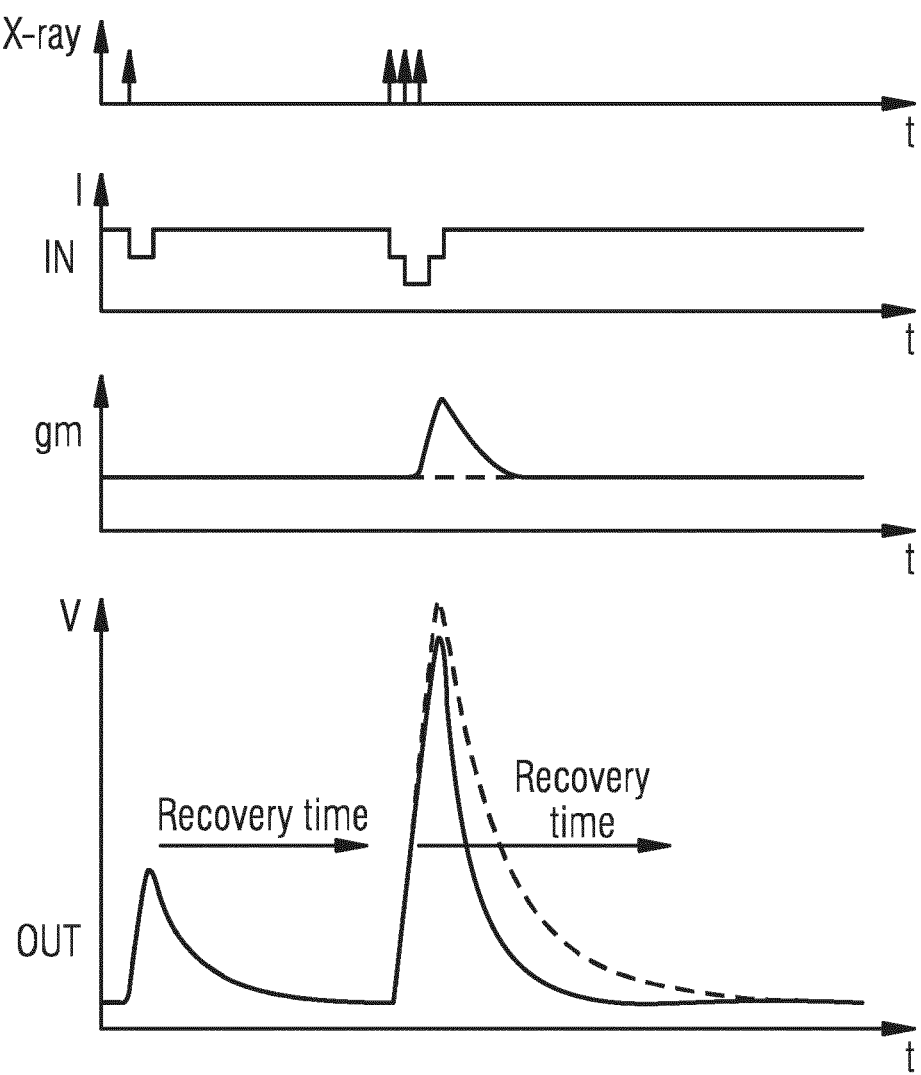

CIRCUIT ARRANGEMENT AND METHOD FOR CHARGE INTEGRATION

CROSS-REFERENCE TO RELATED APPLICATIONS

The present application is a national stage entry according to 35 U.S.C. § 371 of PCT application No.: PCT/EP2020/070956 filed on Jul. 24, 2020; which claims priority to European Patent Application Serial No.: 19191721.0 filed on Aug. 14, 2019; all of which are incorporated herein by reference in their entirety and for all purposes.

TECHNICAL FIELD

The present patent application concerns a circuit arrangement for charge integration, a photon counting arrangement, an x-ray apparatus and a method for charge integration.

BACKGROUND

Circuit arrangements for charge integration are used to count charge pulses. The charge pulses are, for example, generated by x-ray photons hitting a detector material which converts one x-ray photon into a respective charge pulse. By counting these pulses, it is possible to precisely measure the amount of x-ray photons hitting the detector as the amount of charge generated by the detector material is proportional to the energy level of the x-ray. The spectral information can also be determined when measuring the size of the charge pulse.

Typically, the charge is integrated by a capacitance and converted into a voltage at the output of the charge integrator. To remove the charge of a respective charge pulse by discharging, a resistive feedback resistor is used. The RC time constant determines how fast the charge is removed.

In order to allow for a high dynamic range, very high count rates are desirable.

It is an object of the present patent application to increase the accuracy of the charge integration in varying conditions.

SUMMARY

In one embodiment, a circuit arrangement for charge integration comprises an integrating circuit for integrating charge pulses which is connected to an input of the circuit arrangement on its input side and to an output of the circuit arrangement on its output side. The integrating circuit comprises a resistive circuit and a capacitor. The capacitor is used for integrating the charge pulse applied at the input. The resistive circuit is used for removing the charge after integration. Both the resistive circuit and the capacitor define an RC time constant. A feedback control circuit is provided which is connected at its input side to the output of the circuit arrangement and provides a control signal at its output. At least one of the resistive circuit or the capacitor has a variable value depending on the control signal.

When the output voltage is small, the circuit is in a slow but accurate condition. To achieve this, the time constant is large. A large time constant also reduces the noise bandwidth and therefore reduces the input-related noise.

When the output voltage is increasing, the feedback control circuit reduces the RC time constant. In this way, so-called pile-up is avoided.

In other words, the circuit is configured such that at high count rates of charge pulses, the RC time constant is reduced and pile-up is avoided. In contrast, when the count rate of the charge pulses is slowing down, the RC time constant is increased.

In one embodiment, the resistive circuit comprises at least one transistor having a control terminal to which the feedback control signal is connected. In this way, the value of the resistive circuit can be controlled as a function of the control signal.

For example, the transistor can be realized as a metal oxide semiconductor transistor, for example a field-effect transistor, with its gate voltage depending on the control signal. This way, the resistor value of the drain source channel of the transistor is controlled by the control signal via the gate voltage.

In an alternative embodiment, the resistive circuit comprises an operational transconductance amplifier that includes the at least one transistor and provides an output current that depends on the control signal.

For example, the drain current of the operational transconductance amplifier can be controlled by the control voltage. Increasing the drain current, which is the effective current between the operational transconductance amplifier and, for example, the reference voltage node VSS, makes the equivalent feedback resistor smaller.

For example, the output of the circuit arrangement can be connected to a positive input of the operational transconductance amplifier and the output of it can be connected to the input of the circuit arrangement. The negative input of the operational transconductance amplifier can be connected to a reference potential, for example ground.

In one embodiment, the operational transconductance amplifier can be implemented using a differential pair of transistors, the controlled current paths of which are coupled to each other via a current mirror on one side and via a controlled current source to a reference potential on their other side. The control signal controls the current generated by the controlled current source. Of course, other implementations of an operational transconductance amplifier can be implemented as well.

In one embodiment, the controlled signal that is used to control the resistor value of the resistive circuit is an analog signal.

In this way, the resistor value can be controlled in a non-discrete manner depending on the output signal of the integrating circuit.

In one embodiment, a comparator is arranged downstream of the integrating circuit. In this way, the integrating circuit is connected, on its output side, to the comparator. At another input of the comparator at least one detection level, which can be predetermined, is provided. At an output of the comparator a digital integrated signal is provided.

In one embodiment, several of these comparators are used. For example, the comparators are used for energy detection by comparing the charge pulses with respective energy levels. In this way, an energy level of the charge pulse can be detected and also a digital control loop to control the RC time constant of the integrating circuit can be implemented.

In one embodiment, the integrating circuit comprises an amplifier which has an input coupled to the input of the circuit arrangement and an output coupled to the output of the circuit arrangement. The capacitor couples the input of the amplifier to the output of the amplifier and a terminal of the resistive circuit is coupled to the input of the amplifier and a further terminal of the resistive circuit is coupled to the output of the amplifier.

For example, the resistive circuit and the capacitor can be connected to each other in parallel between the output and a negative input of the amplifier, thus creating a negative feedback loop.

The circuit arrangement according to the embodiments described above may be integrated on a semiconductor substrate. For example, the circuit arrangement is integrated on a CMOS chip.

In one embodiment a photon counting arrangement is provided which comprises the circuit arrangement for charge integration. At the input side of the circuit arrangement for charge integration, a converter is provided which converts a photon pulse into a corresponding charge pulse at its output. The charge pulse is then integrated by the circuit arrangement for charge integration as described above.

The advantageous effects of the circuit arrangement for charge integration with a controllable RC time constant based on the output of the integrating circuit are especially useful in photon counting applications, for example x-ray photon counting applications. In this way, the arrangement allows for speeding up the circuit without degrading the noise and spectral resolution at low count rates. The spectral resolution at high count rates is degraded anyway because the x-ray photons will hit the detector with such a small time difference that they start to overlap. But with this proposed principle signal information can still be measured because the recovery time is reduced in such cases.

The photon counting arrangement proposed above can be applied, for example, in x-ray apparatuses like CT scanners, flat panel x-ray scanners and security x-ray scanners.

In one embodiment, a method for charge integration comprises applying a signal representing charge pulses to an integrating circuit, comprising a resistive circuit and a capacitor and having an RC time constant which is a function of the resistive circuit and the capacitor. The integrating circuit provides an integrating signal based on incoming charge pulses and based on the RC time constant.

Furthermore, a control signal is provided by a feedback control circuit depending on the integrated signal or a signal derived from the integrated signal. Depending on the control signal, the variable value of the resistive circuit and/or the capacitor is controlled.

Further aspects of the method are described with reference to the embodiments below.

The method for charge integration may be implemented e.g. with the circuit arrangement according to one of the embodiments described above.

BRIEF DESCRIPTION OF THE DRAWINGS

Further aspects of the present patent application are explained below with reference to the drawings which show exemplary embodiments.

FIG. 3 shows an example of signals according to an embodiment;

Elements that are identical, similar or have the same effect are given the same reference signs in the Figures. The Figures and the proportions of the elements shown in the Figures are not to be regarded as true to scale. Rather, individual elements can be shown exaggeratedly large for better representability and/or for better comprehensibility.

DETAILED DESCRIPTION

Figure 1:
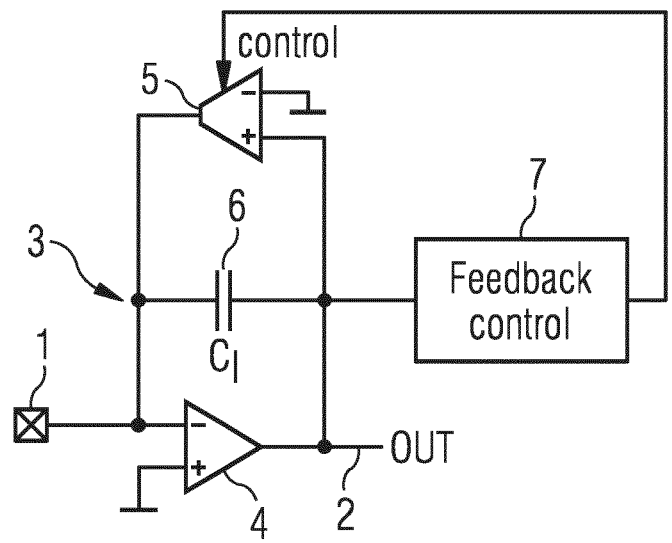
FIG. 1 shows an embodiment of a circuit arrangement for charge integration according to an example.

FIG. 1 shows a circuit arrangement for charge integration according to the proposed principle. The circuit arrangement comprises an input 1 for applying a signal representing charge pulses and an output 2 for providing an integrated signal. An integrating circuit 3 comprises an amplifier 4, a resistive circuit 5 and a capacitor 6.

A feedback control circuit 7 is connected, at its input side, to the output 2 and provides, at its output side, a control signal which is supplied to the resistive circuit 5. The resistive circuit 5 has a variable value depending on the control signal provided by the feedback control circuit 7.

The resistive circuit 5 comprises an operational transconductance amplifier OTA with a positive input which is in that case connected to the output 2 and with a negative input which is connected to ground potential.

The resistive circuit 5 has a resistor value R and the capacitor 6 has a capacitance value C which together represent an RC time constant of the integrating circuit 3.

The feedback control circuit 7 works such that it reduces the RC time constant at increasing values of the integrated signal during operation and wherein the feedback control circuit increases the RC time constant at decreasing values of the integrated signal.

A charge pulse arriving at input 1 is integrated by the capacitance 6 and converted into a voltage at the output 2 of the integrator. The resistive circuit 5 is for removing the charge or, in other words, discharging the capacitor between consecutive incoming charge pulses.

The RC time constant, which is a product of the value of the resistive circuit and the capacitor, defines how fast charge is removed. The pulse duration may be, for example, approximately 10 nanoseconds. The charge size of a charge pulse may be approximately 2.5 Femtocoulomb and the value of the capacitor may be in the range of around 10 Femtofarad. The resistor value may be in the range of 1 to 2 Megaohm.

In other embodiments, the capacitor value may be between 1 and 100 fF.

In other embodiments, the resistor value may be in the range of 0.1 MΩ to 10 MΩ.

With an optional, additional preamplifier in the signal path, e.g. between a detector and a shaper circuit, the values can be multiplied by the gain for the capacitance respectively divided by the gain for the resistor value.

It is an advantage of the resistor being implemented as an active circuit, not only that it is easily controlled by the feedback control circuit, but also that it has better performance with respect to parasitic capacitance.

The technical effects and advantages achieved with the embodiment of FIG. 1 are further explained below with reference to FIG. 3.

Figure 2:
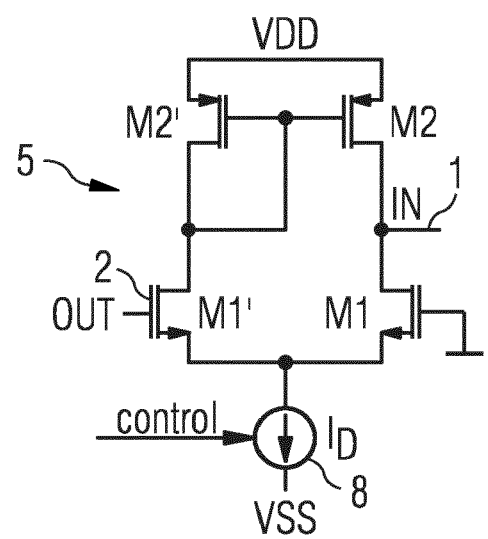
FIG. 2 shows an example of a controllable resistor.

FIG. 2 shows an example of the operational transconductance amplifier of FIG. 1. Differential pair transistors M1, M1' have their source terminals connected together and, via a current source 8 to VSS potential. The current source 8 delivers a drain current as a function of the control signal. The gate of transistor M1 forms the negative input of the OTA and is connected to ground potential. A gate terminal of transistor M1' is connected to the output 2. Each transistor M1, M1' is, in the same current path, serially connected to a complementary transistor M2, M2' with respect to conductivity type. The transistors M2, M2' themselves are connected in the way of a current mirror.

In this way, at the output 1 of the OTA a signal can be derived which is representative of the difference in voltage between the gate voltages of the transistors M1, M1' and which has a current output. This OTA provides a resistance which is equal to 1/gm of the OTA. The gm of the OTA is equal to the gm of the transistor M1. The gm is the transfer rate. FIG. 3 shows exemplary diagrams of several parameters over time according to the embodiments of FIGS. 1 and 2.

Reading this diagram from top to bottom, shown on top are the x-ray photons over time t, then the charge at the input 1 over time, next the gm of the OTA over time which is varied according to the proposed principle and at the bottom the output voltage at the output 2 over time.

Regarding the x-ray photons, it is referred to FIG. 7 below. As explained therein, a detector material is used to convert x-ray photons into respective charge pulses which are shown in the second diagram. In FIG. 3, two incidents are shown, namely at first one x-ray photon hitting the detector and then three x-ray photons hitting the detector.

The first incident creates one small charge pulse and the second incident creates a larger amount of charge pulses at the input 1, as shown in the second diagram.

The single charge pulse does not affect the transfer rate gm because the feedback control circuit will not be active to change the resistor value of the integrating circuit during the first incident. In contrast to this, with the second incident, namely a large number of charge pulses in a short time, the transfer rate gm is increased which means that the resistive value is decreased and also the RC time constant is decreased in this scenario. This increase of gm is triggered by the large number of charge pulses in a short time period and is only temporarily maintained. After the incident, the gm settles back to the value it had before, referred to as a default value.

As can be seen in the output diagram, for the first incident with a single charge pulse the output voltage ramps up and then the charge is removed by the resistive circuit based on the RC time constant. In the second incident, however, the signal without the active feedback control circuit is shown in a dashed line and with the active feedback control circuit is shown in the solid line. It can be seen that the recovery time is reduced significantly by temporarily increasing gm of the OTA.

In this way an accurate circuit in combination with a fast recovery time at high count rates is achieved according to the proposed principle. Moreover, pile-up at the output 2 is avoided.

Figure 4A:
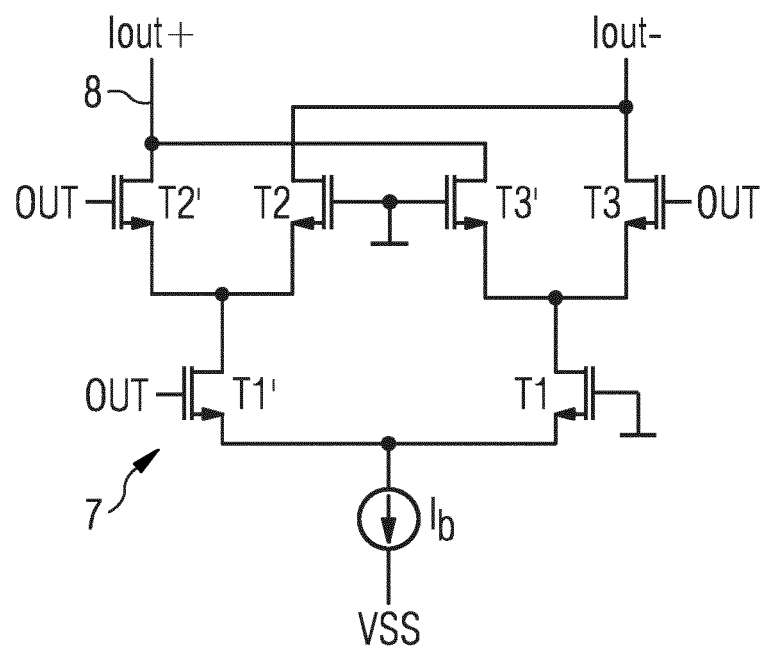
FIG. 4A shows an embodiment of a feedback control circuit.

FIG. 4A shows an exemplary embodiment of the feedback control circuit 7 of FIG. 1. This circuit is basically a multiplier cell where two pairs of differential transistors are cascaded over one pair of differential transistors. The two pairs are cross-coupled to each other on their sides. In more detail, a first pair of transistors T1, T1' is provided with their drain terminals connected to each other, and, over a current source IB to VSS potential.

On their drain sides, the transistors T1, T1' are connected to a respective common source node of two further transistor pairs T2, T2' and T3, T3'. The gate terminals of transistors T1', T2' and T3 are connected to the output 2 of the circuit arrangement for charge integration. The gate terminal transistor T1 is connected to reference potential, for example ground. The drain terminals of the two transistor pairs T2, T2' and T3, T3' are cross-coupled to each other, thus forming a differential output. The positive one of them forms the output of the feedback control circuit 7.

Figure 4B:
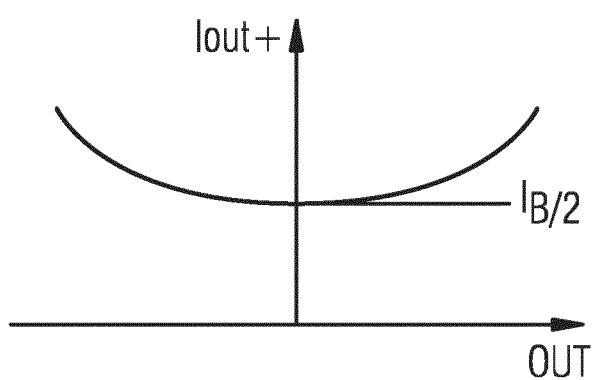
FIG. 4B shows an example of signals reflecting the function of the feedback control circuit of FIG. 4A.

In this way, as can be seen from the diagram of FIG. 4B, with increasing output voltage at the output 2 of the integrating circuit, a control signal is created which also increases in an analog, which means non-discrete, way.

Figure 5:
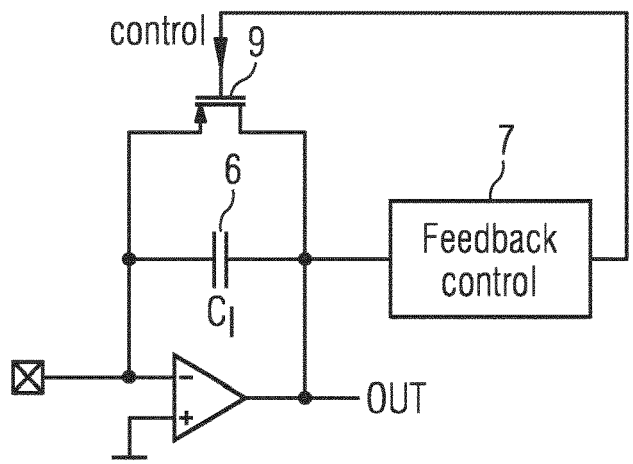
FIG. 5 shows an alternative embodiment with respect to FIG. 1.

FIG. 5 shows an alternative embodiment with respect to the one shown in FIG. 1. Insofar as the two embodiments are identical, the embodiment of FIG. 5 is not described again.

In contrast to FIG. 1, the operational transconductance amplifier is replaced by a single field-effect transistor 9. The source drain channel of transistor 9 which forms a controllable resistor is connected in parallel to capacitor 6. At the gate terminal of transistor 9 the output of the feedback control circuit 7 is connected, thus applying the control signal to the gate of transistor 9 that forms the resistive circuit of the integrating circuit.

Using just one controlled MOSFET is a very simple implementation of the controllable resistive circuit for implementing the present principle.

Figure 6:
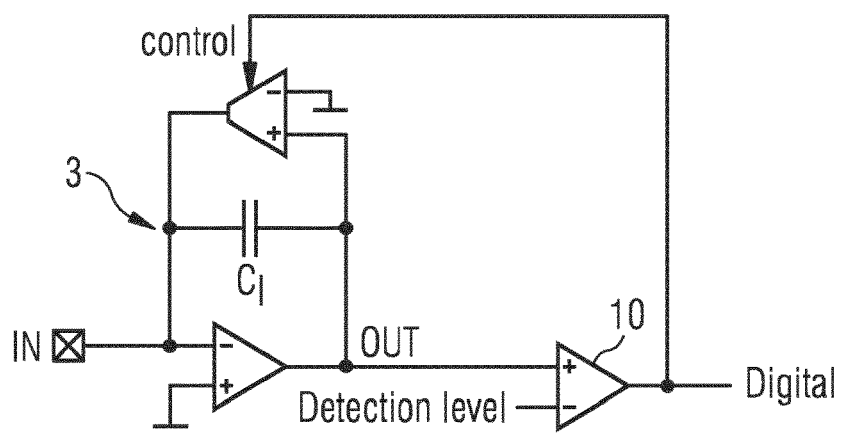
FIG. 6 shows another embodiment of a circuit arrangement.

Another embodiment to control the value of the resistive circuit is shown in FIG. 6. FIG. 6 is another alternative embodiment with respect to FIG. 1 and insofar as the embodiments of FIGS. 1 and 6 are identical, FIG. 6 is not described again.

Instead of the feedback control circuit 7 which generates an analog control signal, a comparator 10 is implemented in FIG. 6. The comparator 10 has a positive input, a negative input and an output. At the output 10, a digital output signal is provided which, on the one hand, represents the integrated signal in digital form and, on the other hand, is fed back to the control input of the resistive circuit 5 implemented as an OTA similar to FIG. 1. The positive input of the comparator 10 is connected to the output of the integrating circuit 3. At the negative input a predetermined detection level can be supplied. If the detection level of the comparator is exceeded, the gm, namely the transfer rate, of the OTA will be increased to reduce the value of the resistive circuit and to reduce the RC time constant. In this way, a digital control loop can be implemented. If the integrated signal in digital form drops again below the detection level, then the gm will be decreased to increase the recovery time again.

In other embodiments, multiple comparators may be connected in parallel to compare the charge pulse with different energy levels. This way a digital output signal may be generated that has more than one bit.

To summarize, with the presented principle according to all embodiments it is possible to avoid the tradeoff between speed and accuracy and to have speed and accuracy at the same time.

The RC time constant is dynamically controlled during operation.

Figure 7:
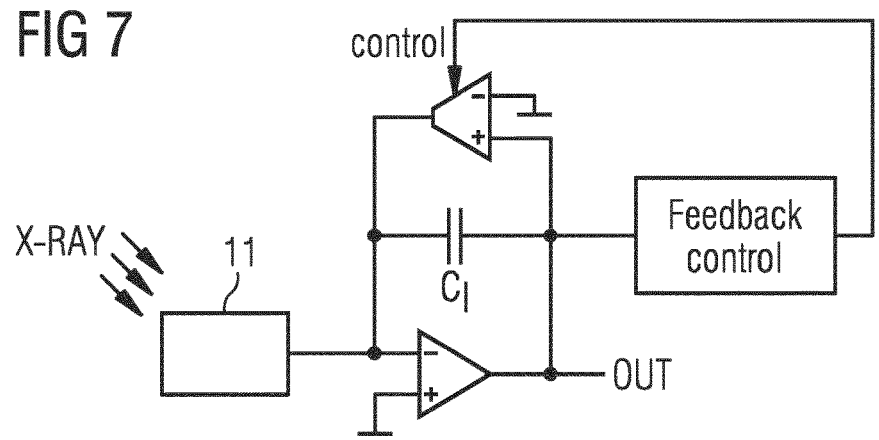
FIG. 7 shows an example of a photon counting arrangement.

FIG. 7 shows an embodiment of a photon counting arrangement having a converter 11 converting a photon pulse, for example an X-Ray photon pulse, into a charge pulse at its output where the output is connected to the input 1 of the circuit arrangement as shown in FIG. 1.

In various applications, the photon counting arrangement is provided in an x-ray apparatus such as a CT scanner, a flat panel apparatus or a security x-ray scanner, both for scanning individuals and/or luggage, or other security applications.

In one embodiment, the converter 11 comprises a conversion material that can be Si, GaAs, CdTe or CdZnTe (CZT).

The conversion material may be a direct conversion semiconductor material.

The invention claimed is:

1. A circuit arrangement for charge integration, wherein the circuit arrangement comprises:
    a first input configured to apply a signal representing charge pulses;
    a first output configured to provide an integrated signal;
    an integrating circuit connected between the first input and the first output, wherein the integrating circuit comprises a resistive circuit and a capacitor and having an RC time constant which is a function of the resistive circuit and the capacitor; and
    a feedback control circuit connected, at a second input, to the first output of the circuit arrangement and configured to provide, at a second output, a control signal;
    wherein at least one of the resistive circuit and the capacitor has a variable value based on the control signal,
    wherein the control signal is an analog signal.

2. The circuit arrangement according to claim 1,
    wherein the feedback control circuit reduces the RC time constant at increasing values of the integrated signal during operation of the integrating circuit, and wherein the feedback control circuit increases the RC time constant at decreasing values of the integrated signal during operation of the integrating circuit.

3. The circuit arrangement according to claim 1,
    wherein the resistive circuit comprises at least one transistor having a control terminal to which the feedback control signal is connected.

4. The circuit arrangement according to claim 3,
    wherein the at least one transistor is realized as a metal oxide semiconductor transistor with its gate voltage based on the control signal.

5. The circuit arrangement according to claim 3,
    wherein the resistive circuit comprises an operational transconductance amplifier comprising the at least one transistor and provides an output current based on the control signal.

6. The circuit arrangement according to claim 1,
    further comprising a comparator arranged downstream of the integrating circuit; wherein the comparator comprises at least one input for providing at least one detection level and an output coupled to the output of the circuit arrangement configured to provide a digital integrated signal.

7. The circuit arrangement according to claim 1,
    wherein the integrating circuit comprises an amplifier having an input coupled to the first input of the circuit arrangement and an output coupled to the first output of the circuit arrangement;
    wherein the capacitor couples the input of the amplifier to the output of the amplifier;
    wherein a terminal of the resistive circuit is coupled to the input of the amplifier and a further terminal of the resistive circuit is coupled to the output of the amplifier.

8. A photon counting arrangement comprising:
    a converter configured to convert a photon pulse into a corresponding charge pulse at its output; and
    the circuit arrangement for charge integration according to claim 1 which is coupled, at the first input, to the output of the converter.

9. An X-Ray apparatus comprising the photon counting arrangement of claim 8.

10. The X-Ray apparatus according to claim 9,
    wherein the X-Ray apparatus is configured as one of the following: a computed tomography x-ray scanner, a flat-panel x-ray apparatus, or a security x-ray scanner.

11. A method for charge integration, wherein the method comprises:
    applying a signal representing charge pulses to an integrating circuit; wherein the integrating circuit comprises a resistive circuit and a capacitor and has an RC time constant which is a function of the resistive circuit and the capacitor;
    providing an integrated signal by the integrating circuit; and
    providing a control signal by a feedback control circuit based on the integrated signal or a signal derived from the integrated signal, wherein the control signal is an analog signal;
    wherein at least one of the resistive circuit and the capacitor has a variable value based on the control signal.

* * * * *